United States Patent
Shibata et al.

(10) Patent No.: US 7,327,013 B2
(45) Date of Patent: Feb. 5, 2008

(54) STENCIL MASK WITH CHARGE-UP PREVENTION AND METHOD OF MANUFACTURING THE SAME

(75) Inventors: Takeshi Shibata, Tsukuba (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 179 days.

(21) Appl. No.: 10/743,522

(22) Filed: Dec. 23, 2003

(65) Prior Publication Data

US 2004/0197675 A1  Oct. 7, 2004

(30) Foreign Application Priority Data

Dec. 26, 2002  (JP) .............................. 2002-376214

(51) Int. Cl.
*H01L 29/06* (2006.01)
(52) U.S. Cl. .............................. 257/618; 257/E21.023; 438/700; 216/45
(58) Field of Classification Search ................ 438/311, 438/700, 734, 744; 428/131, 446, 137, 138, 428/432, 460; 430/312, 313, 296, 5, 314, 430/317, 322, 323, 324; 216/2, 12, 45, 56; 257/618, 622, 623, E21.023; 260/492.2, 260/492.3
See application file for complete search history.

(56) References Cited

U.S. PATENT DOCUMENTS

| | | | |
|---|---|---|---|
| 4,022,927 A | 5/1977 | Pfeiffer et al. | |
| 5,520,297 A | 5/1996 | Kagami et al. | |
| 5,728,492 A * | 3/1998 | Kawata ......................... | 430/5 |
| 5,770,336 A | 6/1998 | Choi | |
| 5,814,423 A | 9/1998 | Maruyama et al. | |
| 5,912,095 A * | 6/1999 | Katakura ........................ | 430/5 |

(Continued)

FOREIGN PATENT DOCUMENTS

JP  04-216613  8/1992

(Continued)

OTHER PUBLICATIONS

Patent Abstracts of Japan "Transmission Mask and Its Manufacture", Publication No. 06-244091, Satoru et al. (Feb. 9, 1994) (English Translation).*

(Continued)

*Primary Examiner*—Lex Malsawma
*Assistant Examiner*—Khiem D Nguyen
(74) *Attorney, Agent, or Firm*—Finnegan, Henderson, Farabow, Garrett & Dunner, L.L.P.

(57) ABSTRACT

A drive unit is described for switching circuit breakers on and off, in particular disconnecting switches and/or grounding switches of medium-voltage switchgear. The drive unit includes a reversible d.c. motor and a switching device containing two separately drivable and interlocked reversing switches, one assigned to each direction of rotation of the d.c. motor, their contacts performing the current reversal on the windings of the d.c. motor as required to reverse the direction of rotation. The drive unit further includes power contactors whose contacts have the required switching capacity for load switching. The all-or-nothing relays and safety switches are implemented by uniform low-power relays representing the direction of rotation, each having at least two electrically isolated relay contacts connected in parallel and also having an equalizing capacitor connected in parallel to each. Such drive units are used in connection with switchgear for power transmission and distribution.

23 Claims, 8 Drawing Sheets

U.S. PATENT DOCUMENTS

| | | | |
|---|---|---|---|
| 5,935,739 A * | 8/1999 | Bayer et al. | 430/5 |
| 6,004,700 A * | 12/1999 | Greschner et al. | 430/5 |
| 6,214,498 B1 * | 4/2001 | Choi | 430/5 |
| 6,296,925 B1 * | 10/2001 | Itoh | 428/138 |
| 6,447,688 B2 * | 9/2002 | Kim | 216/12 |
| 6,492,070 B1 * | 12/2002 | Kobinata | 430/5 |
| 6,555,297 B1 * | 4/2003 | Lercel | 430/313 |
| 6,770,402 B2 * | 8/2004 | Suguro et al. | 430/5 |
| 6,812,473 B1 * | 11/2004 | Amemiya | 250/492.22 |
| 7,022,607 B2 * | 4/2006 | Yoshizawa | 438/689 |
| 7,060,996 B2 * | 6/2006 | Moriya et al. | 250/492.23 |
| 2002/0058400 A1 | 5/2002 | Suguro et al. | |

FOREIGN PATENT DOCUMENTS

| | | |
|---|---|---|
| JP | 4-216613 | 8/1992 |
| JP | 4-243118 | 8/1992 |
| JP | 4-243118 A | 8/1992 |
| JP | 06-244091 | 9/1994 |
| JP | 2001-267207 A | 9/2001 |

OTHER PUBLICATIONS

Notification for Reasons of Rejection (and translation), Japanese Patent Office, Jan. 21, 2005.

Notification of First Office Action issued by the People's Republic of China Patent Office for Patent Application Serial No. 2003-10113083.7 and English translation thereof.

Preliminary Search Report mailed by the French Patent Office on Feb. 24, 2006 in a couterpart foreign application.

* cited by examiner

STENCIL MASK WITH CHARGE-UP PREVENTION AND METHOD OF MANUFACTURING THE SAME

CROSS-REFERENCE TO RELATED APPLICATIONS

This application is based upon and claims the benefit of priority from the prior Japanese Patent Application No. 2002-376214, filed Dec. 26, 2002, the entire contents of which are incorporated herein by reference.

BACKGROUND OF THE INVENTION

1. Field of the Invention

This invention relates to a stencil mask used in semiconductor processes and a method of manufacturing the stencil mask.

2. Description of the Related Art

Semiconductor device manufacturing processes include the process of forming a plurality of metal oxide semiconductor field-effect transistors (MOSFETs) differing in the conductivity type of channels in a substrate or the process of forming a plurality of MOSFETs differing in threshold voltage. In the process, when impurity ions are implanted into wells, channels, or polysilicon layers, a stencil mask having openings in it is used. The stencil mask is provided a specific distance above the semiconductor substrate. Impurity ions are implanted into a specific region through the stencil mask.

A stencil mask is used to irradiate particles or electromagnetic waves onto a substrate to be processed. The particles include charged particles, such as electrons or ions, and neutral particles, such as atoms, molecules, or neutrons. Electromagnetic waves include light and X rays.

A stencil mask in semiconductor processes is generally formed out of an silicon-on-insulator (SOI) substrate 100 in the processes shown in FIGS. 10A to 10D. Hereinafter, the processes of manufacturing a stencil mask will be explained.

Figure 10A:
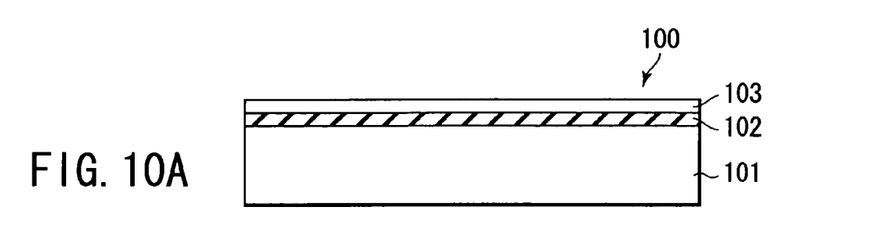
FIGS. 10A to 10D are sectional views showing the processes of manufacturing a stencil mask in the prior art.

FIG. 10A shows an ordinary SOI substrate 100. The SOI substrate 100 is formed by, for example, implanting oxygen ions into a silicon substrate 101 and then annealing the resulting substrate at a high temperature. A silicon oxide film 102 is formed at a depth of several tens to several hundreds of nanometers from the top surface of the silicon substrate 101. On the silicon oxide film 102, a silicon thin film 103 is formed.

Figure 10B:
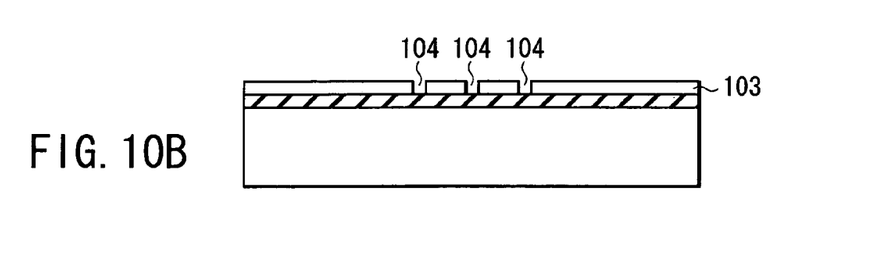

Next, as shown in FIG. 10B, a resist (not shown) is applied to the surface of the silicon thin film 103. The resist is processed by lithographic techniques, thereby forming a resist pattern. Thereafter, with the resist pattern as a mask, the silicon thin film 103 is etched anisotropically until the silicon oxide film 102 is exposed. After openings 104 are made in the silicon thin film 103, the resist pattern is removed.

Figure 10C:
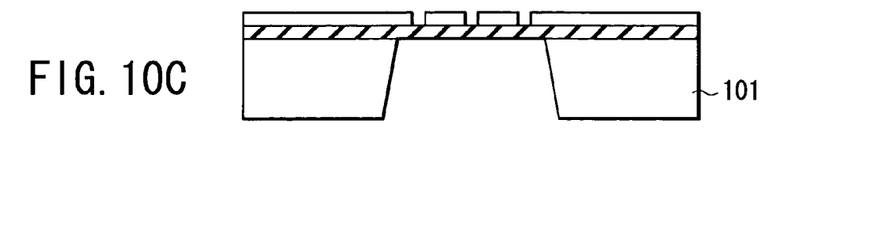

Next, as shown in FIG. 10C, a resist (not shown) is applied to the back of the silicon substrate 101. The resist is processed by lithographic techniques, thereby forming a resist pattern. Thereafter, the silicon substrate 101 is etched isotropically with a chemical liquid, such as KOH. Specifically, the part where no resist pattern is formed on the silicon substrate 101 is etched isotropically until the silicon oxide film 102 is exposed, thereby forming a support 105. Thereafter, the resist pattern is removed.

Figure 10D:
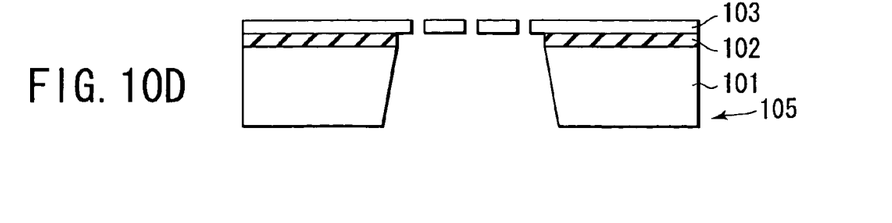

Next, as shown in FIG. 10D, the silicon oxide film 102 exposed in the process of FIG. 10C is processed from its back with chemical liquid, such as fluoric acid, thereby removing the silicon oxide film 102 and exposing the silicon thin film 103. In this way, a stencil mask 105 with the openings 104 in it is formed.

Figure 11A:
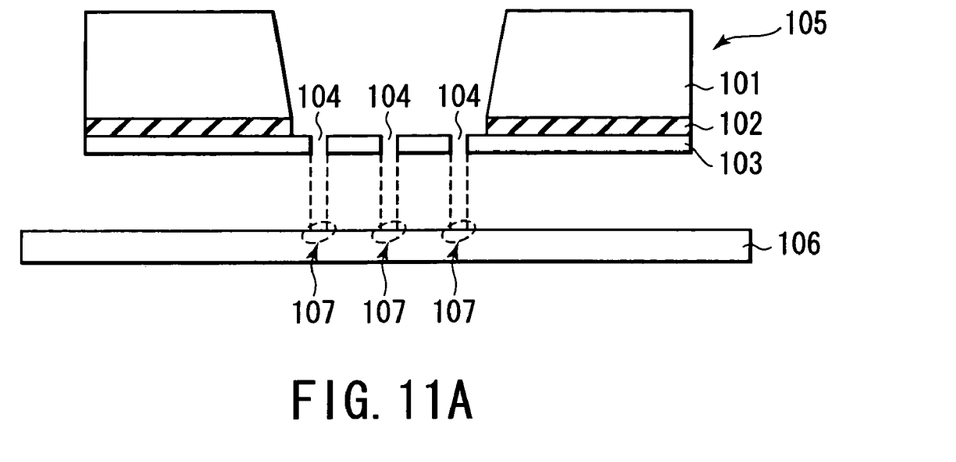
FIGS. 11A and 11B are sectional views showing the positional relationship between a stencil mask and a substrate to be processed in the prior art.
Figure 11B:
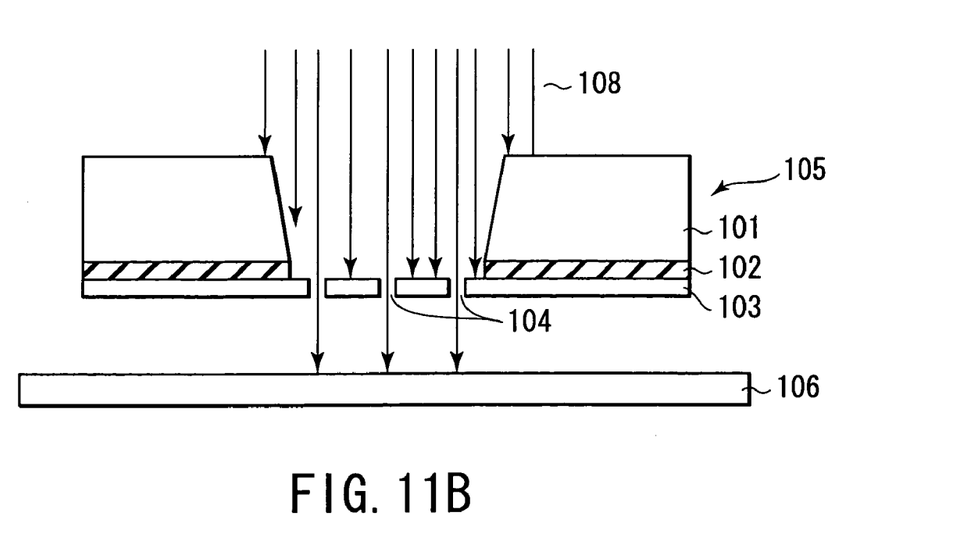

As shown in FIGS. 11A and 11B, in the processes of manufacturing a semiconductor device, when impurity ions are implanted into a semiconductor substrate 106 to be processed, the stencil mask in which the openings 104 have been made is used.

As shown in FIG. 11A, above the ion implantation regions 107 of the semiconductor substrate 106, the stencil mask 105 is provided so that the openings 104 in the stencil mask 105 may face the region 107.

Next, as shown in FIG. 11B, impurity ions 108 are implanted from above the stencil mask 105. The impurity ions 108 pass through the openings 104 in the stencil mask 105 and are implanted into the ion implantation regions 107 of the semiconductor substrate 106. Since there is no opening 104 in the non-implantation region, impurity ions 108 are cut off by the stencil mask 105. In this way, the stencil mask 105 cuts off ions repeatedly, allowing the cut-off ions to be accumulated, which gives rise to a charge-up problem.

The stencil mask 105 is composed of the silicon thin film 103 in which an opening pattern is formed, a support 101 that supports the silicon thin film 103, and a silicon oxide film 102, an insulating film, between the silicon thin film 103 and the support 101. Therefore, the electrical conductivity of the stencil mask 105 is low, which causes the amount of charge accumulated in the stencil mask to increase.

Charged particles are implanted from a charged particle implanting source above the stencil mask through the openings in the stencil mask into the semiconductor substrate. When the stencil mask is charged up, however, the charges accumulated in the stencil mask bend the trajectories of the charged particles implanted vertically from above. The changes in the trajectories cause the charged particles to be implanted into the semiconductor substrate in such a manner they deviate from the predetermined implantation region of the semiconductor substrate.

Furthermore, bringing the charged-up stencil mask closer to the semiconductor substrate causes the silicon thin film of the stencil mask to be deformed by electrostatic force, which is a problem. To avoid the effect of such charge-up on the stencil mask, the following configurations have been developed.

A first method is to cover the surface of a stencil mask with a metal film whose electrical conductivity is high. This configuration has been disclosed in, for example, Jpn. Pat. Appln. KOKAI Publication No. 6-244091. Since in the method, the stencil mask is covered with a metal film whose electrical conductivity is high, the charged-up charges are allowed to escape in a short time and therefore the amount of the accumulation is low. Therefore, it is possible to prevent the trajectories of the charged particles implanted from being bent by the accumulated charges.

A second method is to provide a conductive material film whose electrical conductivity is high in place of the insulating film formed between the silicon thin film and the support. This method has been disclosed in, for example, Jpn. Pat. Appln. KOKAI Publication No. 4-216613.

In the first method, however, when charged particles are implanted, the metal film covering the stencil mask is sputtered due to the collision of charged particles, with the result that the semiconductor substrate to be processed can be contaminated.

Furthermore, in the process of forming a metal film on the stencil mask, the metal film also adheres to the sidewall of the opening pattern formed in the silicon thin film part. As a result, the metal film formed on one side or both sides of the silicon thin film projects into the openings, causing the problem of narrowing the opening pattern in the silicon thin film part.

On the other hand, the second method requires a plurality of processes to form a conductive material film between the silicon thin film part and the support. Consequently, the stencil mask manufacturing processes become complicated, which leads to an increase in the manufacturing cost. Therefore, there have been demands for a stencil mask capable of suppressing the contamination of a semiconductor substrate and reducing charge-up.

BRIEF SUMMARY OF THE INVENTION

According to a first aspect of the present invention, there is provided a stencil mask comprising: a conductive thin film with openings in the film; an insulating film formed in the region of conductive thin film excluding the openings; a conductive support formed on the insulating film; and a conducting member which is formed through the insulating film and which connects the conductive support and the conductive thin film electrically.

According to a second aspect of the present invention, there is provided a stencil mask comprising: a conductive thin film which has a first region and a second region outside the first region, the first region including a plurality of first openings; an insulating film which is formed in a region corresponding to the second region of a first side of the conductive thin film; a conductive support which is formed in a region corresponding to the second region of the conductive thin film via the insulating film; a second opening which is formed through the conductive support and the insulating film; and a conducting member which is provided in the second opening and which connects the conductive thin film and the conductive support electrically.

According to a third aspect of the present invention, there is provided a stencil mask comprising: a conductive thin film which has a first region and a second region, the first region including a plurality of first openings; an insulating film formed corresponding to the second region of the conductive thin film; a conductive support formed on the insulating film; a second opening made in the conductive thin film and the insulating film in the second region of the conductive thin film; and a conducting member which is formed in the second opening and which connects the conductive thin film and the conductive support electrically.

According to a fourth aspect of the present invention, there is provided a stencil mask comprising: a conductive thin film which has a first region and a second region, the first region including a plurality of first openings; an insulating film formed corresponding to the second region of the conductive thin film; a conductive support formed on the insulating film; a second opening made in the conductive thin film and the insulating film in the second region of the conductive thin film; and a conducting member which is formed on the surface of the conductive thin film and in the second opening and which connects the conductive thin film and the conductive support electrically.

According to a fifth aspect of the present invention, there is provided a mask forming substrate comprising: a conductive thin film having a first region and a second region; an insulating film formed on the conductive thin film; a conductive support formed on the insulating film; an opening made in the conductive support and a region of the insulating film corresponding to the second region of the conductive thin film; and a conducting member which is formed in the opening and which connects the conductive thin film and the conductive support electrically.

According to a sixth aspect of the present invention, there is provided a mask forming substrate comprising: a conductive thin film having a first region and a second region; an insulating film formed on the conductive thin film; a conductive support formed on the insulating film; an opening made in the conductive film and a region of the insulating film corresponding to the second region of the conductive thin film; and a conducting member which is formed on the conductive thin film and in the opening and which connects the conductive thin film and the conductive support electrically.

According to a seventh aspect of the present invention, there is provided a stencil mask manufacturing method comprising: making a plurality of openings in a first region of a conductive thin film of an SOI substrate which includes a substrate, an insulating film formed on the substrate, and the conductive thin film with the first region and a second region formed on the insulating film; forming a support by removing the substrate in a region corresponding to the first region of the conductive thin film and the substrate in a part of a region corresponding to the second region of the conductive thin film; removing the insulating film corresponding to the first region and second region exposed as a result of the formation of the support; and forming a conducting member electrically connecting the substrate and the conductive thin film in a region corresponding to the second region from which the insulating film has been removed, the conducting member having a higher electrical conductivity than that of each of the substrate and the conductive thin film.

According to an eighth aspect of the present invention, there is provided a stencil mask manufacturing method comprising: making first openings in a first region of and a second opening in a second region of a conductive thin film of an SOI substrate which includes a substrate, an insulating film formed on the substrate, and the conductive thin film with the first region and the second region formed on the insulating film; forming a support by removing the substrate in a region corresponding to the first region; removing the insulating film exposed as a result of the formation of the support; and forming a conducting member in the second opening of the conductive thin film, the conducting member having a higher electrical conductivity than that of each of the substrate and the conductive thin film.

According to a ninth aspect of the present invention, there is provided a stencil mask manufacturing method comprising: forming a concave portion in which an insulating film is exposed in a region corresponding to a second region of a substrate of an SOI substrate which includes the substrate, an insulating film formed on the substrate, and a conductive thin film with a first region and the second region formed on the insulating film; removing the exposed insulating film; forming a conducting member in the concave portion, the conducting member having a higher electrical conductivity than that of each of the substrate and the conductive thin film; making openings in a region corresponding to the first region of the conductive thin film; and removing the substrate and insulating film corresponding to the first region.

According to a tenth aspect of the present invention, there is provided a mask forming substrate manufacturing method comprising: forming a concave portion by removing a substrate and an insulating film corresponding to a second region of an SOI substrate which includes the substrate, the insulating film formed on the substrate, and a conductive thin film formed on the insulating film and having a first region as an opening formation region and the second region around the first region; and forming a conducting member in the concave portion, the conducting member having a higher electrical conductivity than that of each of the substrate and the conductive thin film.

According to an eleventh aspect of the present invention, there is provided a stencil mask manufacturing method comprising: making a first opening by removing a conductive thin film and an insulating film corresponding to a second region of an SOI substrate which includes a substrate, the insulating film formed on the substrate, and the conductive thin film with a first region and the second region formed on the insulating film; forming a conducting member in the entire surface of the conductive thin film and in the first opening, the conducting member having a higher electrical conductivity than that of each of the substrate and the conductive thin film; making a second opening by removing the conducting member and the conductive thin film corresponding to the first region; and forming a support by removing the substrate and insulating film corresponding to the first region.

According to a twelfth aspect of the present invention, there is provided a mask forming substrate manufacturing method comprising: making a first opening by removing a conductive thin film and an insulating film corresponding to a second region of an SOI substrate which includes a substrate, the insulating film formed on the substrate, and the conductive thin film with a first region and the second region formed on the insulating film; and forming a conducting member in the entire surface of the conductive thin film and in the first opening, the conducting member having a higher electrical conductivity than that of each of the substrate and the conductive thin film.

According to a thirteenth aspect of the present invention, there is provided a mask forming substrate comprising: a conductive thin film having a first region and a second region; an insulating film formed on the conductive thin film; a conductive support formed on the insulating film; an opening formed in the conductive thin film corresponding to the second region and the insulating film; and a conductive member which is formed in the opening and which connects the conductive thin film and the conductive support electrically.

DETAILED DESCRIPTION OF THE INVENTION

Referring to the accompanying drawings, embodiments of the present invention will be explained.

First Embodiment

Figure 1A:
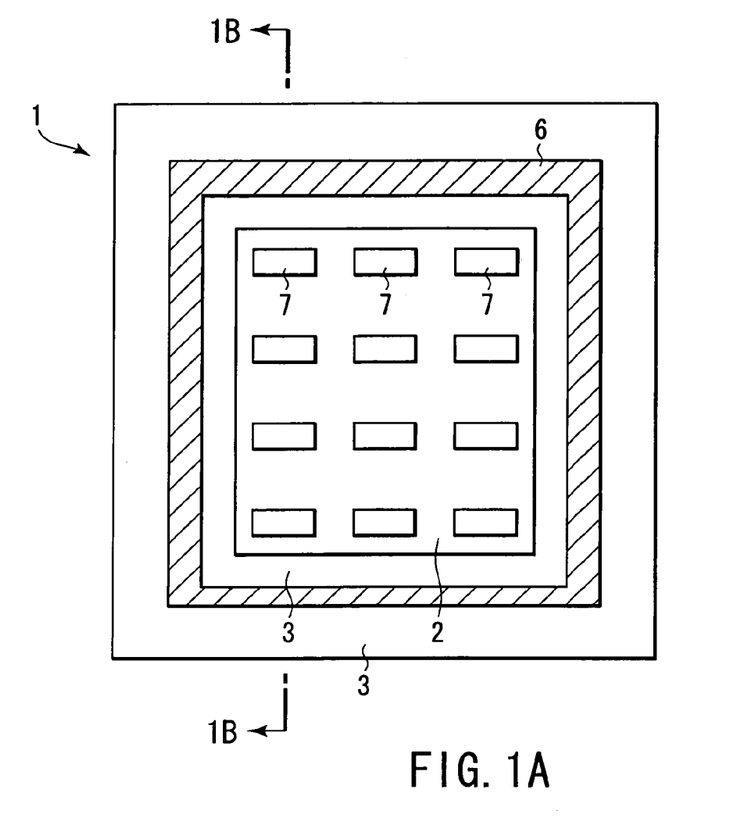
FIG. 1A is a plan view of a stencil mask according to a first embodiment of the present invention.
Figure 1B:
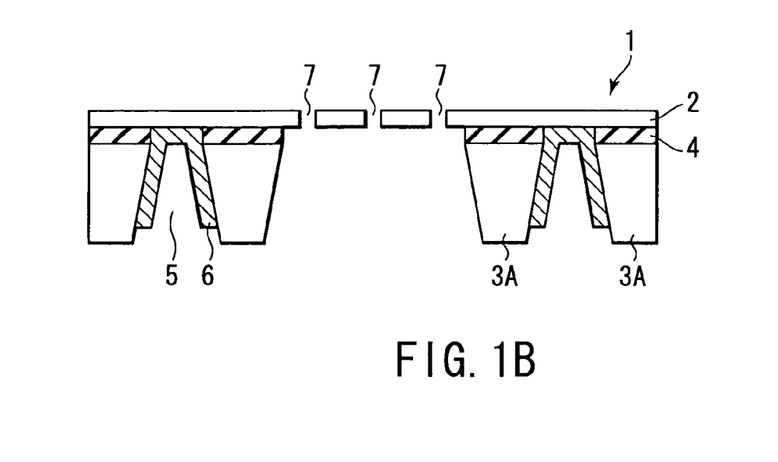
FIG. 1B is a sectional view taken along line 1B-1B of FIG. 1A.

FIG. 1A is a plan view of the back of a stencil mask according to a first embodiment of the present invention. FIG. 1B is a sectional view of the stencil mask.

A stencil mask 1 comprises a silicon thin film 2 having a plurality of openings 7 in it, a support 3A made of silicon which supports the silicon thin film 2, and a silicon oxide film 4 acting as an insulating film formed between the silicon thin film 2 and the support 3A.

The support 3A has a concave portion 5 formed around the plurality of openings 7. In the concave portion 5, a metal film, such as a tungsten film 6 whose electrical conductivity is high, is formed. The tungsten film 6 connects the silicon thin film 2 and support 3A to each other electrically. The metal film connecting the silicon thin film 2 and support 3A electrically is not restricted to the tungsten film 6 and may be any material, as long as the material has a high electrical conductivity. In addition, the insulating film is not limited to the silicon oxide film 4.

FIGS. 2A to 2F show the processes of manufacturing a stencil mask 1 according to the first embodiment.

Figure 2A:
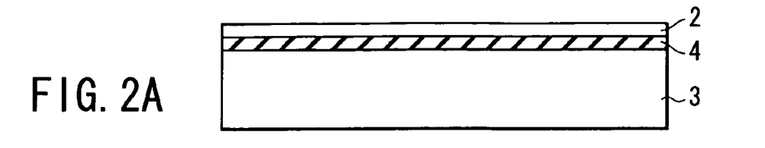
FIGS. 2A to 2F are sectional views showing the processes of manufacturing a stencil mask according to the first embodiment.

FIG. 2A shows an SOI substrate. The SOI substrate is formed as follows. After oxygen ions are implanted into, for example, a silicon substrate 3, the resulting substrate is annealed at high temperature. As a result, a silicon oxide film 4 is formed at a depth of several tens or several hundreds of nanometers from the surface of the silicon substrate 3. On the silicon oxide film 4, a silicon thin film 2 is formed. An SOI substrate manufacturing method is not limited to this and an SOI substrate may be formed by another manufacturing method, such as a bonding method.

Figure 2B:
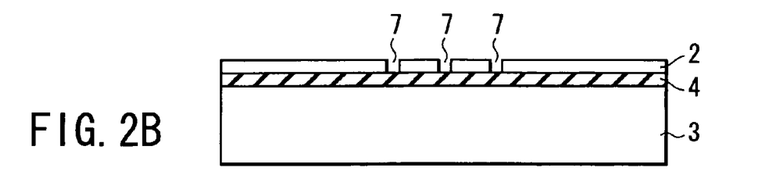

Next, as shown in FIG. 2B, a resist (not shown) is applied to the silicon thin film 2. Then, the resist is patterned by lithographic techniques. Thereafter, with the resist as a mask, the silicon thin film 2 is etched anisotropically until the silicon oxide film 4 is exposed, thereby making openings 7 in the silicon thin film 2. Then, the unnecessary resist is removed.

Figure 2C:
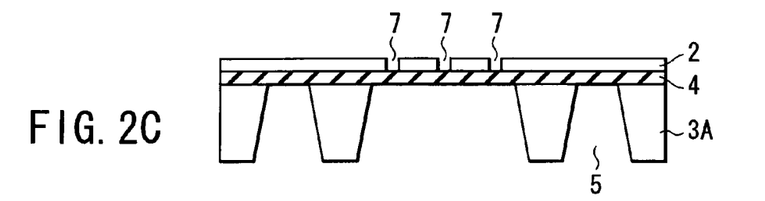

Next, as shown in FIG. 2C, a resist (not shown) is applied to the back of the silicon substrate 3. Then, the resist is patterned by lithographic techniques. Thereafter, with the resist pattern as a mask, the silicon substrate 3 is treated with chemical liquid, such as KOH. The part of the silicon substrate 3 where no resist has been formed is etched isotropically until the silicon oxide film 4 is exposed. As a result, the regions corresponding to the plurality of openings 7 in the silicon substrate 3 are removed, thereby forming a support 3A. Moreover, a concave portion 5 is formed in the support 3A so as to correspond to the periphery of the openings 7.

Figure 2D:
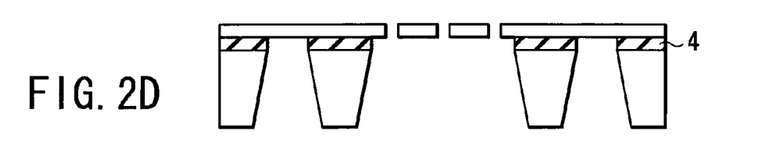

Next, as shown in FIG. 2D, the silicon oxide film 4 exposed in the process of FIG. 2C is processed from its back with chemical liquid, such as fluoric acid, thereby removing the silicon oxide film 4.

Figure 2E:
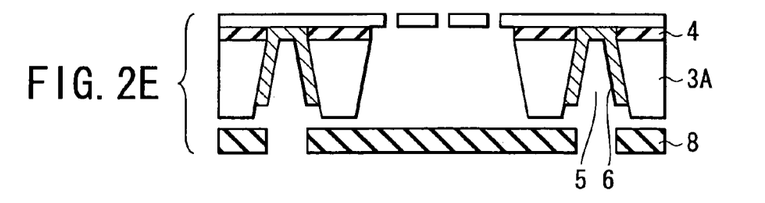

Next, as shown in FIG. 2E, a mask 8 having openings corresponding only to the concave portion 5 of the support 3A is placed on the back of the silicon substrate. Using the mask 8, for example, a tungsten film 6 is formed in the concave portion 5 by sputtering techniques. The tungsten film 6 is formed on the back of the silicon thin film 2 exposed in the concave portion 5 and on the sidewalls of the silicon oxide film 4 and support 3A in the concave portion 5. The method of forming the tungsten film 6 is not limited to the sputtering techniques. Another metal film forming method may be used instead.

Figure 2F:
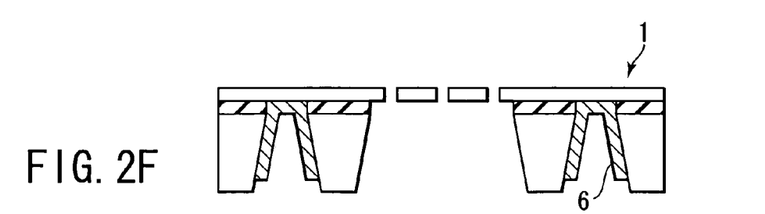

Next, as shown in FIG. 2F, the unnecessary mask 8 is removed, which completes the stencil mask 1.

With the first embodiment, the tungsten film 6 whose electrical conductivity is high connects the support 3A to the silicon thin film 2, which suppresses the charging up of the stencil mask 1. Since the tungsten film 6 is formed in the wide area around the openings 7, the charging up of the stencil mask 1 can be suppressed reliably.

Figure 3:
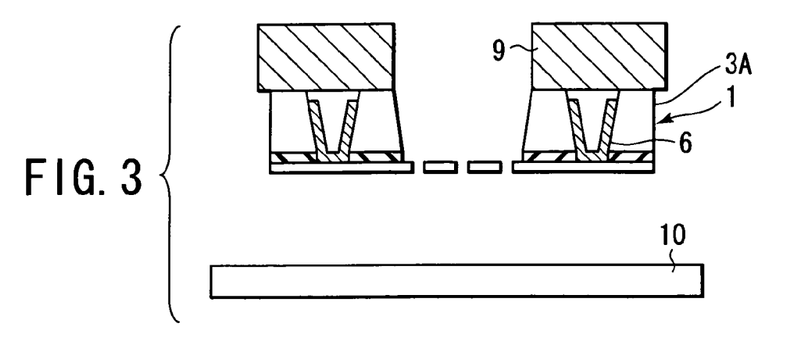
FIG. 3 is a sectional view showing the positional relationship between a stencil mask, an electrostatic chuck for holding the stencil mask, and a substrate to be processed in an implanting apparatus.

As shown in FIG. 3, when charged particles are implanted into the semiconductor substrate 10 through the stencil mask 1, the stencil mask 1 is positioned a specific distance away from the semiconductor substrate 10. The support 3A of the stencil mask 1 is caught by the electrostatic chuck 9. As a result, the tungsten film 6 is covered with the electrostatic chuck and therefore is not exposed. Since the tungsten film 6 is not exposed when charged particles are implanted, there is no possibility that the tungsten film 6 will be sputtered. Consequently, the semiconductor substrate 10 will not be contaminated with tungsten.

Figure 4:
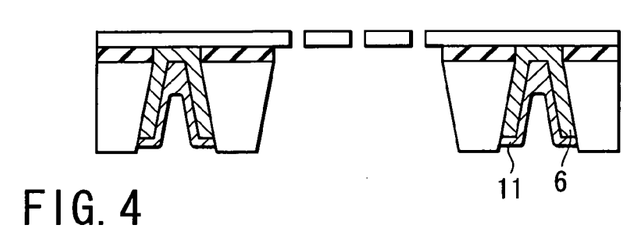
FIG. 4 is a sectional view of a modification of the first embodiment.

As shown in FIG. 4, a protective film 11 made of, for example, polysilicon or amorphous silicon may be formed on the surface of the tungsten film 6. In this configuration, the tungsten film 6 is covered with the projective film 11, which prevents more reliably the semiconductor substrate from being contaminated with tungsten.

Furthermore, since the tungsten film 6 is formed in the support 3 around the plurality of openings 7, the tungsten film 6 does not contact the openings 7 in the silicon thin film. Consequently, the openings 17 are not made narrower.

As in the first embodiment, after a metal film, such as the tungsten film 6, is formed, the metal film may be heat-treated, thereby forming a silicide layer at the interface between the tungsten film 6 and silicon. With such a configuration, the same effect can be obtained as in the first embodiment. In this case, after the silicide layer is formed, the metal film may be removed.

In addition, another metal film may be deposited directly by sputtering techniques or CVD (Chemical Vapor Deposition) techniques instead of the tungsten film 6. The deposited metal film may be further heat-treated, thereby turning the metal film into a silicide layer.

Second Embodiment

Hereinafter, a stencil mask according to a second embodiment of the present invention will be explained. In the second embodiment, the structure of the stencil mask is the same as in FIGS. 1A and 1B. The second embodiment differs from the first embodiment in the manufacturing method.

FIGS. 5A to 5F shows the manufacturing processes in the second embodiment.

Figure 5A:
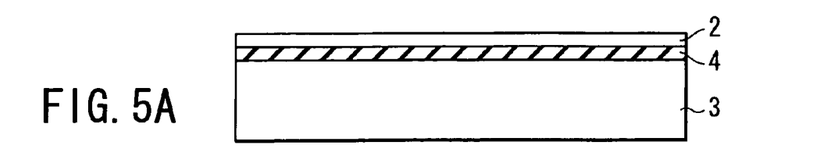
FIGS. 5A to 5F are sectional views showing the processes of manufacturing a stencil mask according to a second embodiment of the present invention.

FIG. 5A shows an SOI substrate. The SOI substrate comprises a silicon substrate 3, a silicon oxide film 4, and a silicon thin film 2. Since the processes of manufacturing an SOI substrate are the same as in the first embodiment, explanation of them will be omitted.

Figure 5B:
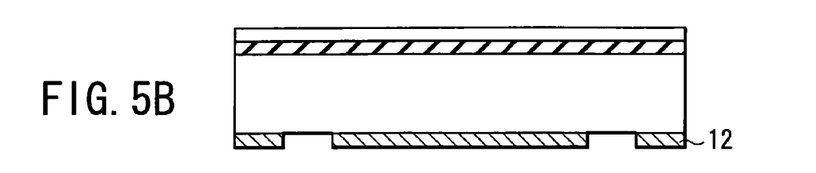

Next, as shown in FIG. 5B, a resist is applied to the back of the silicon substrate 3. Then, a resist pattern 12 is formed by lithographic techniques.

Figure 5C:
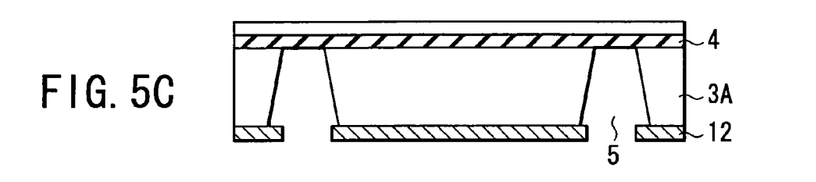

Next, as shown in FIG. 5C, with the resist pattern 12 as a mask, the silicon substrate 3 is treated with chemical liquid, such as KOH, thereby etching the silicon substrate 3 isotropically until the silicon oxide film 4 is exposed. In this way, a support 3A with a concave portion 5 is formed.

Figure 5D:
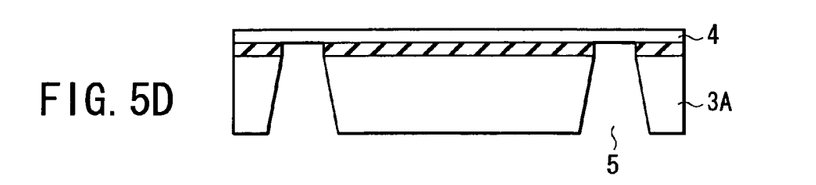

Next, as shown in FIG. 5D, the resist pattern 12 is removed. Then, the silicon oxide film 4 exposed in the concave portion 5 is removed with chemical liquid, such as fluoric acid.

Figure 5E:
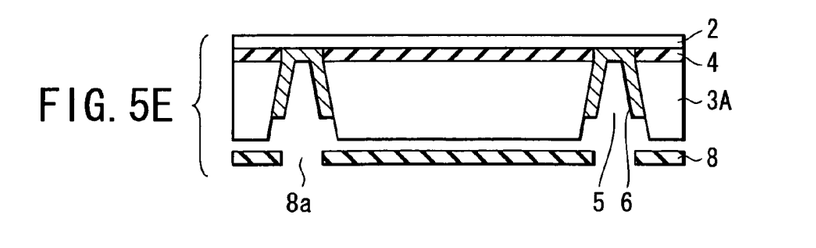

Next, as shown in FIG. 5E, a mask 8 having openings corresponding to the concave portion 5 of the silicon substrate 3 is positioned at the support 3A. Then, a tungsten film 6 is formed in the concave portion 5 by sputtering techniques. The tungsten film 6 is formed on the silicon thin film 2 exposed in the concave portion 5 and the sidewalls of the silicon oxide film 4 and silicon substrate 3.

The method of forming the tungsten film 6 is not limited to sputtering techniques. Another metal film forming method may be used instead. As in the first embodiment, to suppress the contamination of the semiconductor substrate, a protective film made of, for example, polysilicon or amorphous silicon, may be formed on the surface of the tungsten film 6. In addition, polysilicon or the like may be formed not only in the concave portion 5 but also on the entire surface of the back of the silicon substrate 3.

Figure 5F:
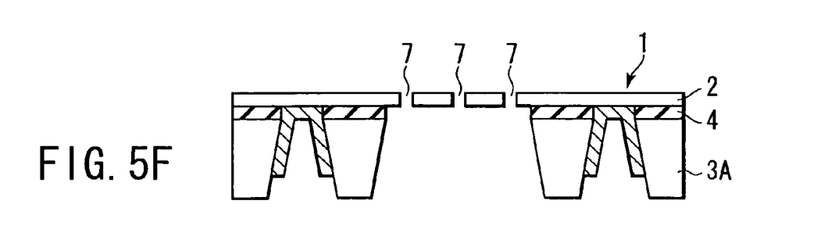

Next, as shown in FIG. 5F, a resist (not shown) is applied to the silicon thin film 2. Then, a resist pattern is formed by lithographic techniques. With the resist pattern as a mask, the silicon thin film 2 is etched anisotropically until the silicon oxide film 4 is exposed, thereby making a plurality of openings 7 in the silicon thin film. Thereafter, the resist is removed.

Next, a resist (not shown) is applied to the back of the silicon substrate 3. Then, a resist pattern is formed by lithographic techniques. Thereafter, with the resist pattern as a mask, the silicon substrate 3 corresponding to the plurality of openings 7 is etched isotropically with chemical liquid, such as KOH, until the silicon oxide film 4 is exposed. Thereafter, the unnecessary resist is removed.

Next, the silicon oxide film 4 exposed is processed from its back with chemical liquid, such as fluoric acid, thereby removing the silicon oxide film 4. In this way, the stencil mask 1 is formed.

With the second embodiment, a metal film, such as the tungsten film 6 whose electrical conductivity is high, connects the silicon thin film 2 and the silicon substrate 3 electrically before the openings are made. Therefore, when the silicon substrate 3 where the silicon thin film 2 and silicon substrate 3 are electrically connected by the metal film, such as the tungsten film 6 with a high electrical conductivity, is formed beforehand as shown in FIG. 5E, only the process of making the openings 7 as shown in FIG. 5F is left undone, after the opening pattern 7 of the stencil mask 1 is determined. Therefore, it is possible to shorten the time required to manufacture the stencil mask 1.

As in the first embodiment, a silicide layer may be formed instead of the tungsten film 6.

Third Embodiment

Hereinafter, a stencil mask according to a third embodiment of the present invention will be explained.

In the first and second embodiments, the silicon thin film 2 and the silicon substrate 3 are connected to each other by the tungsten film 6 provided in the concave portion 5 of the support 3A. In contrast, in the third embodiment, the silicon thin film 2 and the silicon substrate 3 are connected electrically to each other without forming a concave portion in the support 3A.

Figure 6:
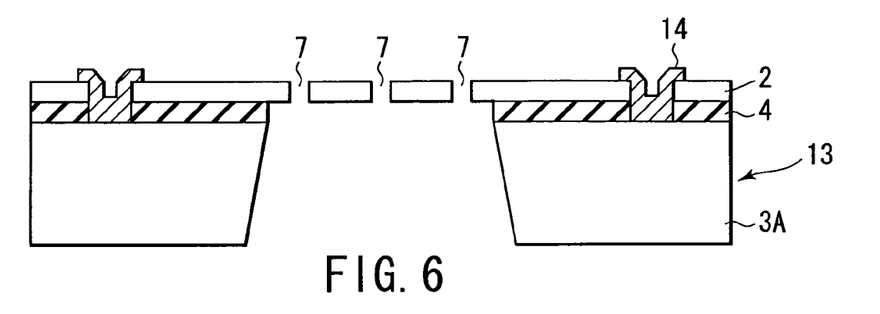
FIG. 6 is a sectional view of a stencil mask according to a third embodiment of the present invention.

In FIG. 6, a stencil mask 13 comprises a silicon thin film 2 in which an opening pattern 7 is formed, and a support 3A made of silicon for supporting the silicon thin film 2. Between the silicon thin film 2 and the support 3A, a silicon oxide film 4 as an insulating film, is formed.

In the silicon thin film 2 and silicon oxide film 4 located around the opening pattern 7, a groove is made. In the groove, a tungsten film 14 that connects the silicon thin film 2 and the support 3A to conduct electrically is formed.

The metal film 14 that connects the silicon thin film 2 and the support 3A electrically is not restricted to a tungsten film and may be any material, provided that it has a high electrical conductivity. The insulating film 4 is also not limited to a silicon oxide film.

The processes of manufacturing the stencil mask 13 of the third embodiment will be explained by reference to FIGS. 7A to 7F.

Figure 7A:
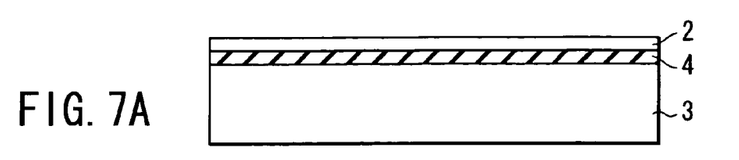
FIGS. 7A to 7F are sectional views showing the processes of manufacturing a stencil mask according to the third embodiment.

FIG. 7A shows an SOI substrate. Since the processes of manufacturing an SOI substrate are the same as in the first and second embodiments, explanation of them will be omitted.

Figure 7B:
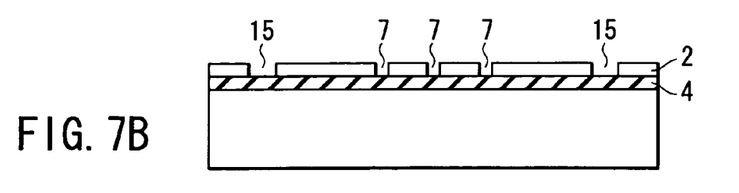

As shown in FIG. 7B, a resist (not shown) is applied to the silicon thin film 2. Then, a resist pattern is formed by lithographic techniques. Thereafter, with the resist pattern as a mask, the silicon thin film 2 is etched anisotropically until the silicon oxide film 4 is exposed. In this way, a plurality of openings 7 are made in the silicon thin film 2 and an opening 15 is made around the openings 7. Thereafter, the unnecessary resist is removed. The openings 7 forms an opening pattern for allowing charged particles to be implanted into the substrate to be processed. The opening 15 is made so as to correspond a support explained later.

Figure 7C:
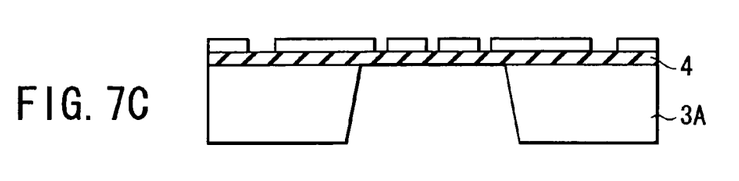

Next, as shown in FIG. 7C, a resist (not shown) is applied to the back of the silicon substrate 3. Then, the resist is patterned by lithographic techniques. The resist pattern covers the regions excluding the region corresponding to the openings 7. With the resist pattern as a mask, the silicon substrate 3 is treated with chemical liquid, such as KOH. In this treatment, the part of the silicon substrate 3 where no resist has been formed is etched isotropically until the silicon oxide film 4 is exposed. In this way, the support 3A is formed. Thereafter, the resist is removed.

Figure 7D:
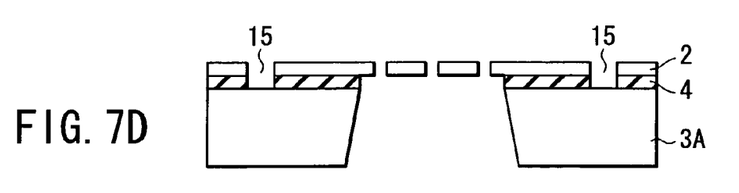

Next, as shown in FIG. 7D, the silicon oxide film 4 exposed in the process of FIG. 7C and the silicon oxide film 4 exposed in the opening 15 in the process of FIG. 7B are treated with chemical liquid, such as fluoric acid, thereby removing the silicon oxide film 4.

Figure 7E:
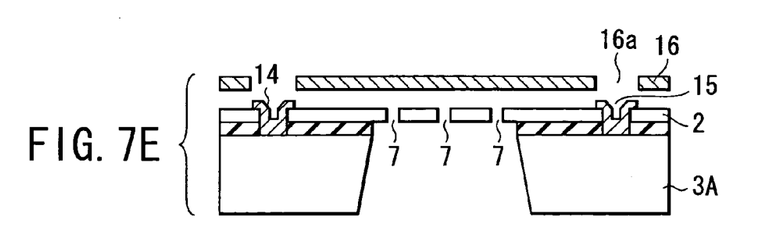

Next, as shown in FIG. 7E, a mask 16 is formed a specific distance above the silicon thin film 2. The mask 16 has an opening 16a corresponding only to the opening 15 in the silicon thin film. By sputtering from above the mask 16, a tungsten film 14 is formed in the opening 15 in the silicon thin film 2. The tungsten film 14 is formed on the top of the support 3A and the sidewalls of the silicon oxide film 4 and silicon thin film 2. The method of forming the tungsten film 14 is not limited to the sputtering techniques. Another metal film forming method may be used instead.

Figure 7F:
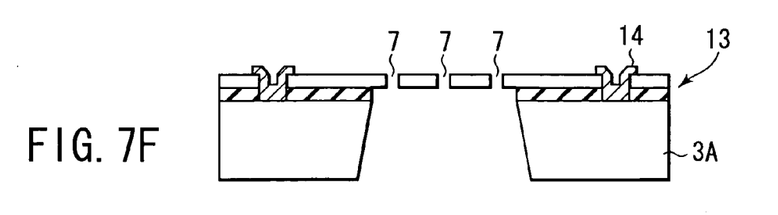

Next, as shown in FIG. 7F, the mask 16 is removed, which completes the stencil mask 13.

With the third embodiment, the tungsten film 14 whose electrical conductivity is high connects the silicon thin film 2 to the support 3A electrically, which suppresses the charging up of the stencil mask 3.

Figure 8:
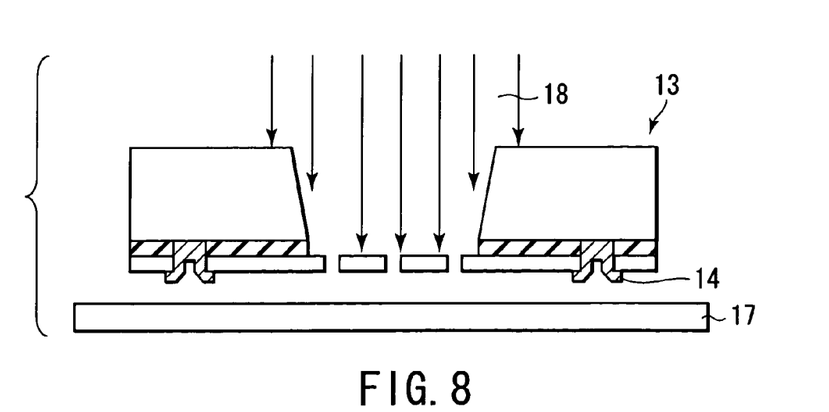
FIG. 8 is a sectional view showing the positional relationship between a stencil mask and a substrate to be processed in an implanting apparatus.

As shown in FIG. 8, when charged particles 18 are implanted into the semiconductor substrate 17 through the stencil mask 13 of the third embodiment, the side where the tungsten film 14 is exposed faces the semiconductor substrate 17. Therefore, even when charged particles 18 are implanted, they do not collide with the tungsten film 14. Consequently, the semiconductor substrate 17 is prevented from being contaminated with tungsten.

As in the first embodiment, polysilicon, amorphous silicon, or the like may be formed on the surface of the tungsten film 14, which further suppresses the contamination of the semiconductor substrate 17.

Furthermore, as in the first embodiment, a metallic silicide layer may be formed instead of the tungsten film. With this configuration, too, the same effect as that of the third embodiment can be obtained.

Fourth Embodiment

FIGS. 9A to 9F show the processes of manufacturing a stencil mask according to a fourth embodiment of the present invention.

Figure 9A:
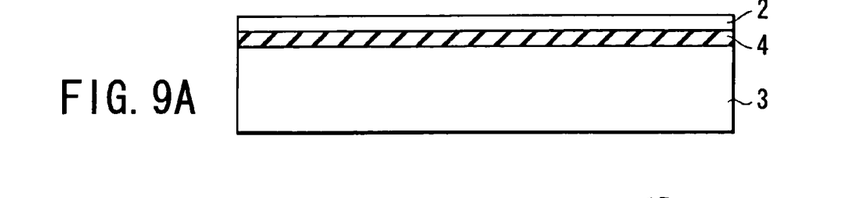
FIGS. 9A to 9F are sectional views showing the processes of manufacturing a stencil mask according to a fourth embodiment of the present invention.

FIG. 9A shows an SOI substrate. Since the processes of manufacturing an SOI substrate are the same as in the first embodiment, explanation of them will be omitted.

Figure 9B:
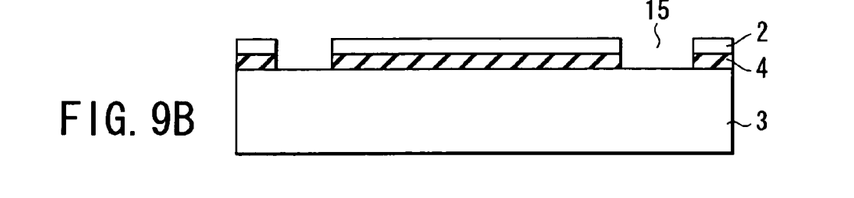

Next, as shown in FIG. 9B, a resist (not shown) is applied to the silicon thin film 2. Then, the resist is patterned by lithographic techniques. With the resist pattern as a mask, the silicon thin film 2 is etched anisotropically until the silicon oxide film 4 is exposed. In this way, an opening 15 is formed in the periphery of the silicon thin film 2. The opening 15 is not an opening pattern for the stencil mask 13 but an opening for allowing the silicon thin film 2 and the support 3A to be connected to each other by a material having a high electrical conductivity. Then, the silicon oxide film 4 exposed in the opening 15 is etched until the silicon substrate 3 is exposed. Thereafter, the resist is removed.

Figure 9C:
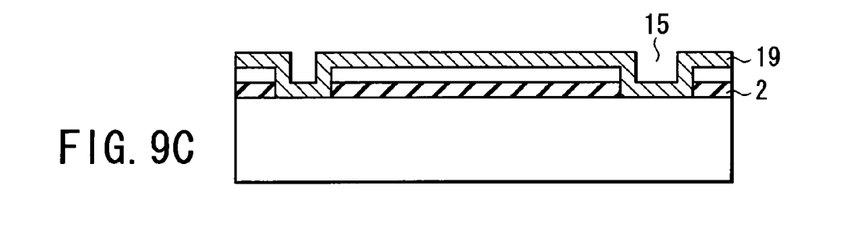

Next, as shown in FIG. 9C, a polysilicon film 19 is formed on the top of the silicon thin film 2 by CVD or the like. The polysilicon film 19 is formed on the entire surface of the silicon thin film 2, on the sidewall of the opening 15, and on the silicon substrate 3.

Figure 9D:
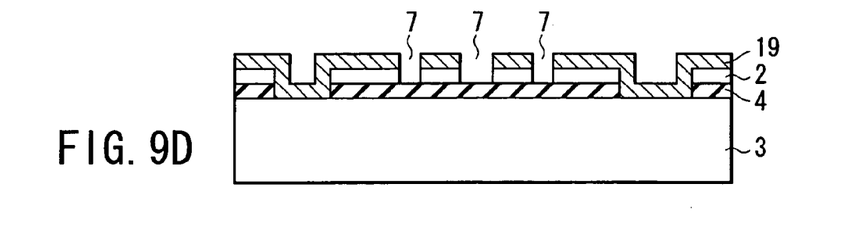

Next, as shown in FIG. 9D, a resist (not shown) is applied to the silicon thin film 2. Then, the resist is patterned by lithographic techniques. The resist pattern covers the region of the opening 15 and is used to form openings in the stencil mask inside the opening 15. With the resist pattern as a mask, the polysilicon film 19 and the silicon thin film 2 are etched anisotropically until the silicon oxide film 4 is exposed, thereby making a plurality of openings 7 in the polysilicon film 19 and the silicon thin film 2. Thereafter, the resist is removed.

Figure 9E:
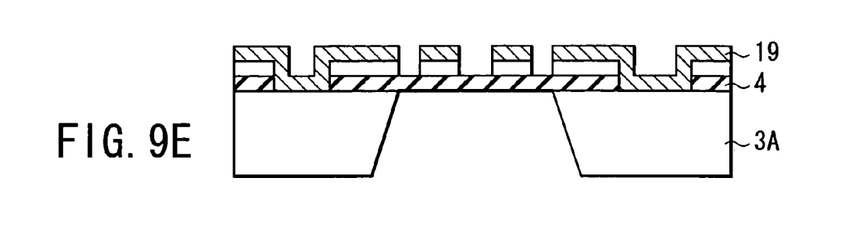

Next, as shown in FIG. 9E, a resist (not shown) is applied to the back of the silicon substrate 3. Then, the resist is patterned by lithographic techniques. The resist pattern covers the regions excluding the region corresponding to the openings 7. With the resist pattern as a mask, the silicon substrate 3 is treated with chemical liquid, such as KOH. In this treatment, the part of the silicon substrate 3 where no resist has been formed is etched isotropically until the silicon oxide film 4 is exposed. In this way, a support 3A is formed. Thereafter, the resist is removed.

Figure 9F:
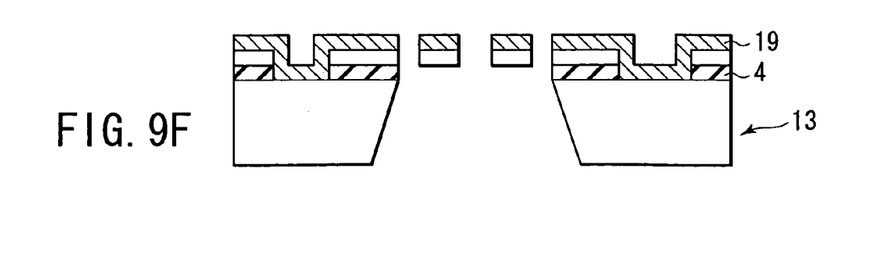

Next, as shown in FIG. 9F, the silicon oxide film 4 exposed in the process of FIG. 9E is treated with chemical liquid, such as fluoric acid, thereby removing the silicon oxide film 4, which completes the stencil mask 13.

With the fourth embodiment, in the manufacturing processes up to FIG. 9C, a substrate where the silicon thin film 2 and the silicon substrate 3 are connected electrically by polysilicon 19 whose electrically conductivity is high is formed beforehand. Forming a silicon substrate beforehand enables the stencil mask 13 to be completed in the manufacturing processes of FIG. 9D to FIG. 9F after the opening pattern 7 of the stencil mask is determined, which shortens the time required to manufacture the stencil mask 13.

The material that connects the silicon thin film 2 and the support 3A electrically is not restricted to polysilicon 19. For instance, such metallic material as amorphous silicon or tungsten film may be used instead.

While in the process of FIG. 9C, the polysilicon 19 has been formed on the entire surface of the silicon thin film 2, the present invention is not limited to this. For instance, the polysilicon 19 may be formed only in the opening 15 in the silicon thin film 12.

Moreover, as in the first embodiment, a metallic silicide layer may be formed instead of the polysilicon 19.

In the first to fourth embodiments, to connect the silicon thin film 2 and the support 3A by a tungsten film whose electrical conductivity is high, the silicon thin film 2 or support 3A is provided with a concave portion and a tungsten film is buried in the concave portion. The number of the concave parts is not limited to one and may be more than one. In addition, the shape of the concave part is not restricted to the ones shown in the embodiments.

Furthermore, the materials for the thin film 2 in which the opening pattern 7 has been formed and the support 3A supporting the thin film 2 are not limited to silicon. For instance, another material, such as SiC, may be used. In this case, too, the same effects as those of the first to forth embodiments can be obtained.

In addition, the insulating film 4 between the thin film 2 and the support 3A is not restricted to a silicon oxide film. For instance, another material, such as a silicon nitride film, may be used. In this case, too, the same effects as those of the first to forth embodiments can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stencil mask comprising:
   a conductive thin film having a plurality of first openings having a first region and a second region peripheral of the first region, first openings being provided in the first region;
   an insulating film formed on the conductive thin film excluding the first openings;
   a conductive support formed on the insulating film, the conductive support having a second opening corresponding to the first openings;
   a third opening formed in one of the conductive thin film and the conductive support and the insulating film; and
   a conducting member formed in the third opening excluding an inner wall of the first openings, the conducting member connecting the conductive support and the conductive thin film electrically.

2. The stencil mask according to claim 1, wherein the electrical conductivity of the conducting member is higher than that of each of the conductive thin film and the conductive support.

3. The stencil mask according to claim 1, wherein the conductive thin film and the conductive support are made of silicon.

4. The stencil mask according to claim 1, wherein the conducting member is made of tungsten.

5. The stencil mask according to claim 1, further comprising silicon or silicide formed on the surface of the conducting member.

6. The stencil mask according to claim 1, wherein the conducting member is formed in the conductive support.

7. The stencil mask according to claim 1, wherein the conducting member is formed in the conductive thin film.

8. The stencil mask according to claim 1, wherein the conducting member is formed on and in the conductive thin film.

9. The stencil mask according to claim 1, wherein the first openings are surrounded by the third opening.

10. A stencil mask comprising:
    a conductive thin film having a first region and a second region peripheral of the first region, the first region including a plurality of first openings so as to form a mask pattern;
    an insulating film formed on the conductive thin film excluding the first openings;
    a conductive support formed on the insulating film, the conductive support having a second opening corresponding to the first openings;
    a third opening formed in the conductive support and the insulating film, the third opening being positioned in the second region; and
    a conducting member provided in the third opening excluding an inner wall of the first openings, the conducting member connecting the conductive thin film and the conductive support electrically.

11. The stencil mask according to claim 10, wherein the electrical conductivity of the conducting member is higher than that of each of the conductive thin film and the conductive support.

12. The stencil mask according to claim 10, wherein the conductive thin film and the conductive support are made of silicon.

13. The stencil mask according to claim 10, wherein the conducting member is made of tungsten.

14. The stencil mask according to claim 10, further comprising silicon or silicide formed on the surface of the conducting member.

15. A stencil mask comprising:
    a conductive thin film having a first region and a second region peripheral of the first region, the first region including a plurality of first openings so as to form a mask pattern;

an insulating film formed on the second region;

a conductive support formed on the insulating film, the conductive support having a second opening corresponding to the first openings;

a third opening formed in the conductive thin film and the insulating film, the third opening being positioned in the second region; and a conducting member formed on the surface of the conductive thin film and in the third opening excluding an inner wall of the first openings, the conducting member connecting the conductive thin film and the conductive support electrically.

16. The stencil mask according to claim 15, wherein the electrical conductivity of the conducting member is higher than that of each of the conductive thin film and the conductive support.

17. The stencil mask according to claim 15, wherein the conductive thin film and the conductive support are made of silicon.

18. The stencil mask according to claim 15, wherein the conducting member is made of tungsten.

19. The stencil mask according to claim 15, further comprising silicon or silicide formed on the surface of the conducting member.

20. A mask forming substrate comprising:

a conductive thin film having a first region and a second region peripheral of the first region the conductive thin film having a plurality of first openings in the first region;

an insulating film formed on the conductive thin film in the second region excluding the first openings;

a conductive support formed on the insulating film, the conductive support having a second opening corresponding to the first openings;

a third opening formed in the conductive support and the insulating film; and a conducting member formed in the third opening excluding an inner wall of the first openings, the conducting member connecting the conductive thin film and the conductive support electrically.

21. The mask forming substrate according to claim 20, wherein the electrical conductivity of the conducting member is higher than that of each of the conductive thin film and the conductive support.

22. The mask forming substrate according to claim 20, wherein the conductive thin film and the conductive support are made of silicon.

23. The stencil mask according to claim 20, wherein the conducting member is made of tungsten.

* * * * *

UNITED STATES PATENT AND TRADEMARK OFFICE
CERTIFICATE OF CORRECTION

PATENT NO.       : 7,327,013 B2
APPLICATION NO.  : 10/743522
DATED            : February 5, 2008
INVENTOR(S)      : Shibata et al.

It is certified that error appears in the above-identified patent and that said Letters Patent is hereby corrected as shown below:

On Title page, item (57), delete the ABSTRACT in its entirety and substitute therefor:

--       In a stencil mask, a conductive thin film has first openings in it. An insulating film is formed in the region of the conductive thin film excluding the first openings. A conductive support is formed on the insulating film. A second opening goes through the conductive support and insulating film and reaches the surface of the conductive thin film. A conducting member is formed in the second opening. The conducting member connects the conductive support and conductive thin film electrically. --

Claim 20, column 14, line 3, change "region the" to -- region, the --.

Signed and Sealed this

Twentieth Day of May, 2008

JON W. DUDAS
*Director of the United States Patent and Trademark Office*